(12) United States Patent
Gu et al.

(10) Patent No.: US 11,728,214 B2
(45) Date of Patent: Aug. 15, 2023

(54) TECHNIQUES FOR SELECTIVE TUNGSTEN CONTACT FORMATION ON SEMICONDUCTOR DEVICE ELEMENTS

(71) Applicant: Applied Materials, Inc., Santa Clara, CA (US)

(72) Inventors: Sipeng Gu, Clifton Park, NY (US); Wei Zou, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 17/341,080

(22) Filed: Jun. 7, 2021

(65) Prior Publication Data

US 2022/0392804 A1   Dec. 8, 2022

(51) Int. Cl.
*H01L 21/768* (2006.01)
*H01L 23/532* (2006.01)
*H01L 23/535* (2006.01)
*H01L 27/06* (2006.01)
*H01L 49/02* (2006.01)

(52) U.S. Cl.
CPC ............... *H01L 21/76895* (2013.01); *H01L 21/76805* (2013.01); *H01L 21/76859* (2013.01); *H01L 21/76876* (2013.01); *H01L 21/76879* (2013.01); *H01L 23/535* (2013.01); *H01L 23/53257* (2013.01); *H01L 27/0629* (2013.01); *H01L 28/20* (2013.01); *H01L 28/40* (2013.01)

(58) Field of Classification Search
CPC ......... H01L 21/76895; H01L 21/76805; H01L 21/76859; H01L 21/76876; H01L 21/768879; H01L 23/535; H01L 28/20
See application file for complete search history.

(56) References Cited

PUBLICATIONS

Itoch et al., "Mechanism for initial stage of Selective tungsten growth employing a WF6 and SiH14 mixture"; 1991 J Japanese Journal of Applied Physics, vol. 30, No. 7R, 6 pages.
Green et al., "Structure of Selective low pressure chemically vapor-deposited films"; Journal of The Electrochemical Society, vol. 132, No. 5; 9 pages.
Hennessy et al., "Selective CVD Tungsten on Silicon Implanted SiO2", Journal of The Electrochemical Society, vol. 135, No. 7; 6 pages.

*Primary Examiner* — Samuel A Gebremariam
(74) *Attorney, Agent, or Firm* — KDW Firm PLLC

(57) ABSTRACT

A method may include providing a device structure in the semiconductor device. The device structure may include a buried device contact, a first dielectric layer, disposed over the buried device contact; and a device element, where the device element includes a TiN layer. The method may include implanting an ion species into the TiN layer, wherein the ion species comprises a seed material for selective tungsten deposition.

20 Claims, 9 Drawing Sheets

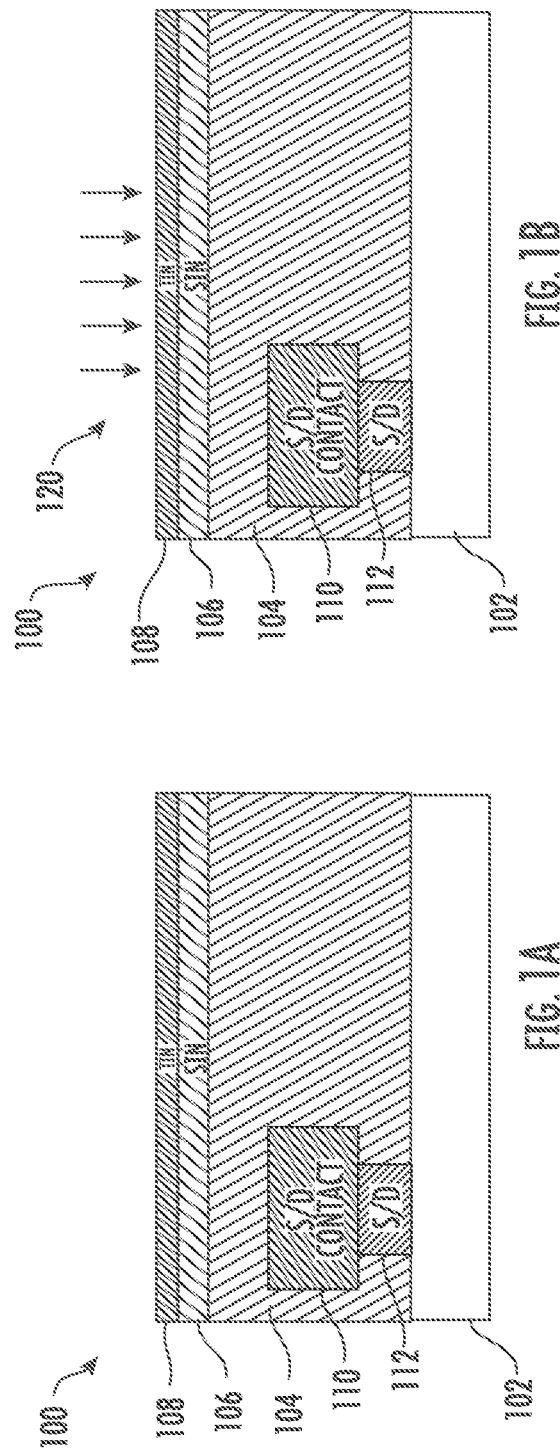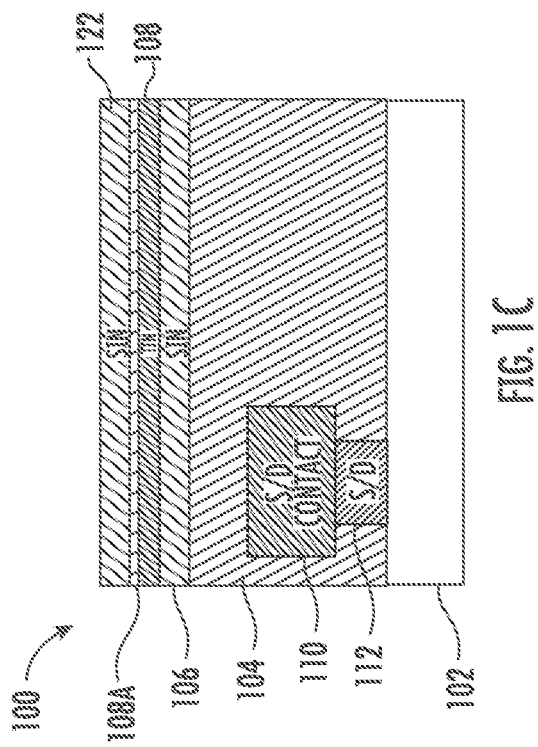

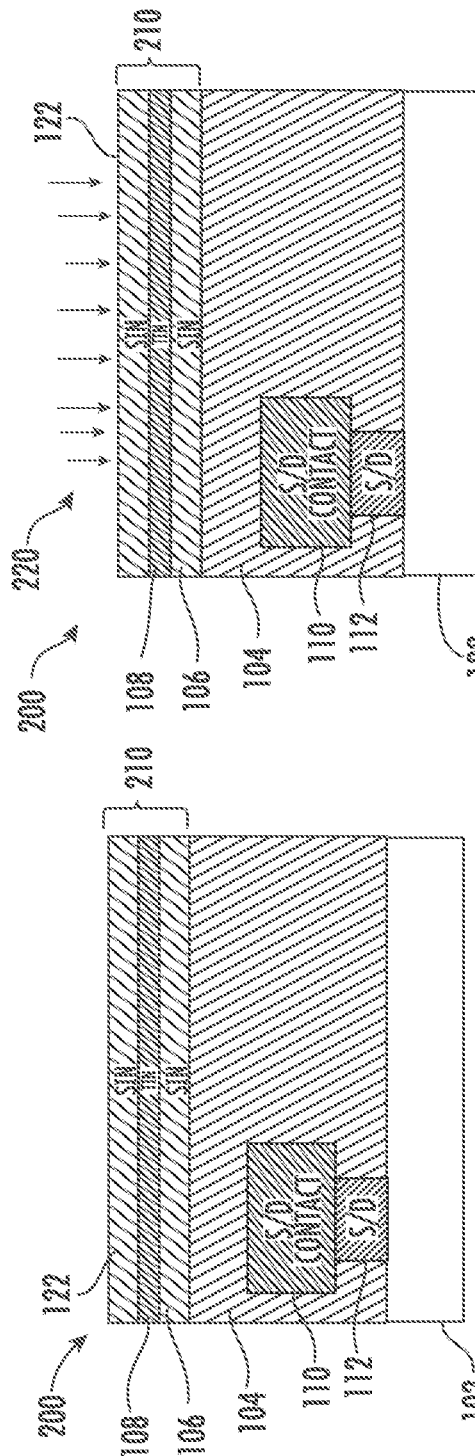
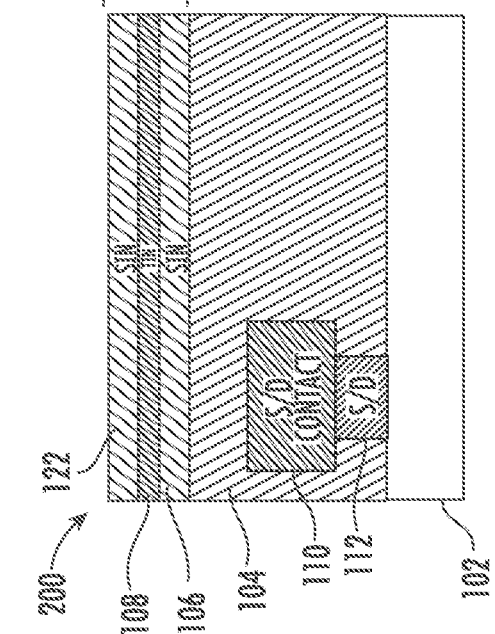
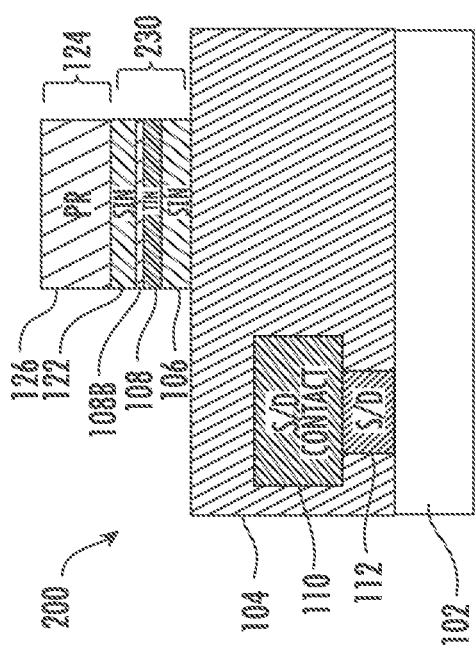
FIG. 2A
FIG. 2B
FIG. 2C

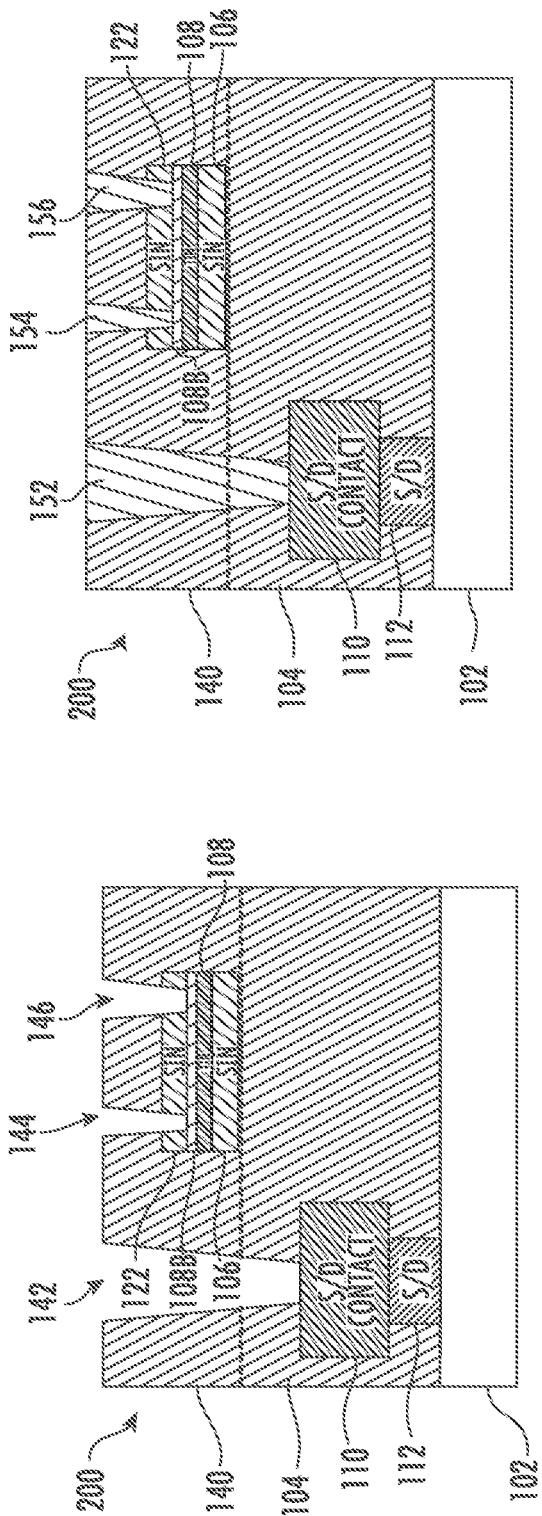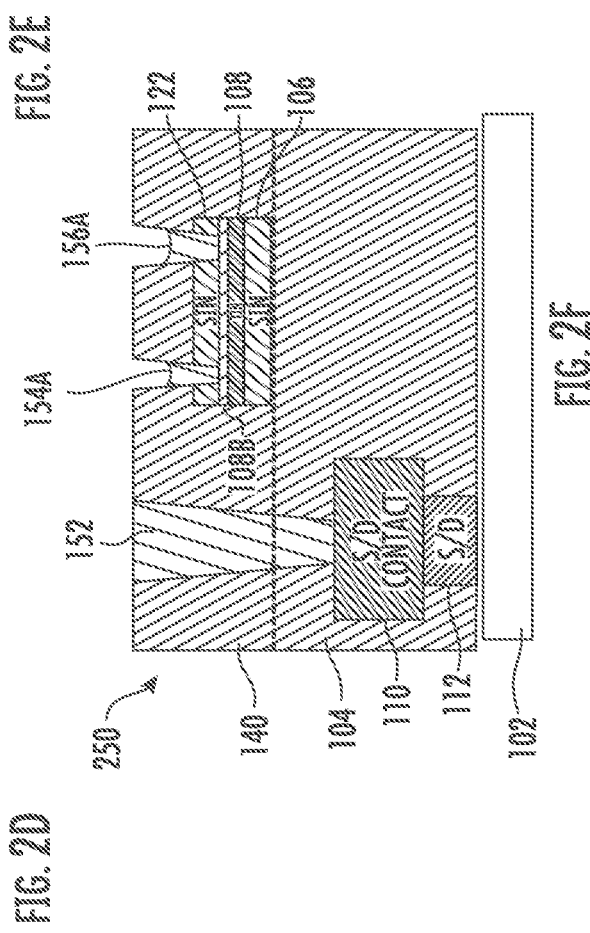

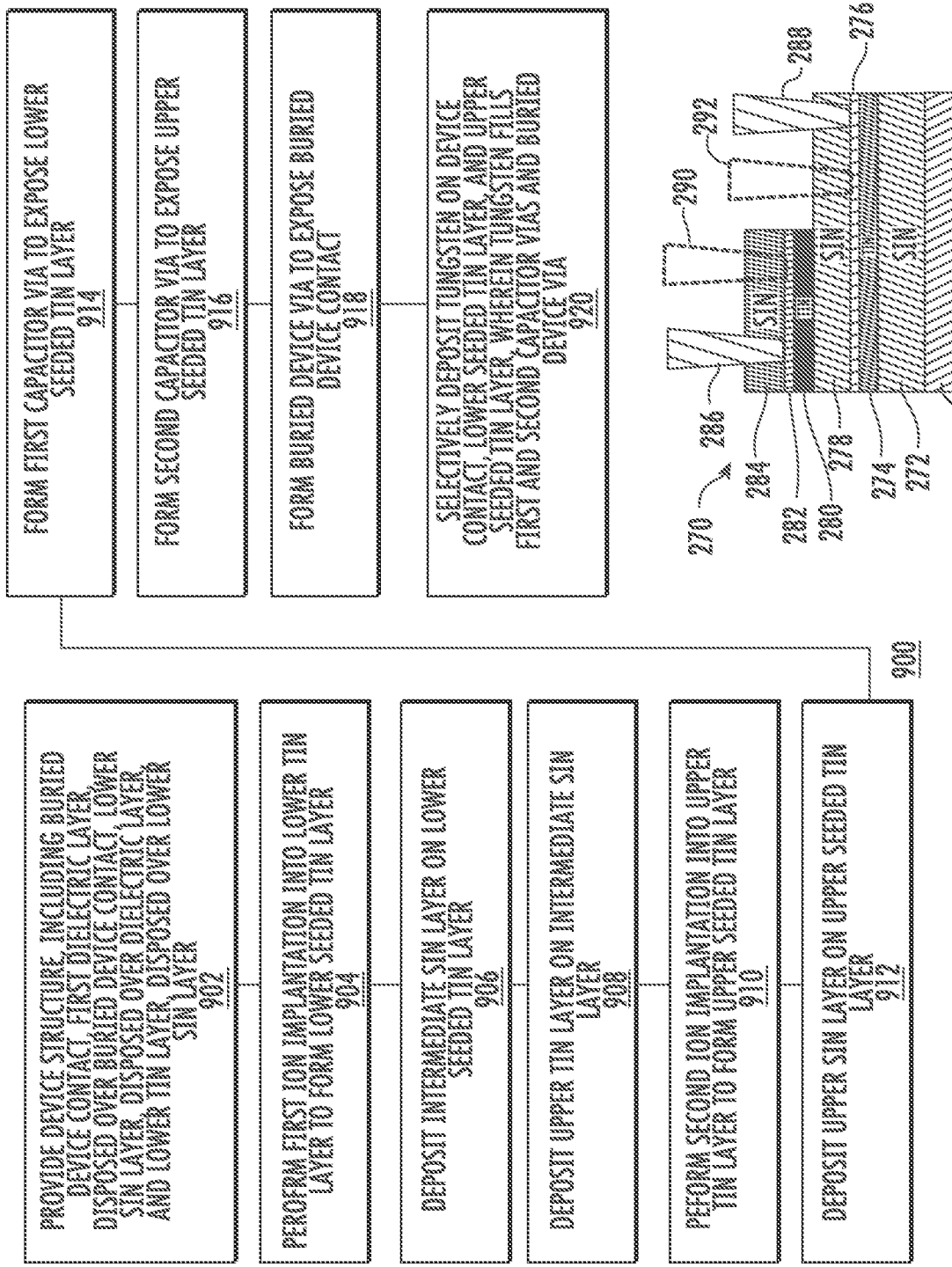

TECHNIQUES FOR SELECTIVE TUNGSTEN CONTACT FORMATION ON SEMICONDUCTOR DEVICE ELEMENTS

FIELD OF THE DISCLOSURE

The present disclosure relates to semiconductor devices, and more particularly, to tungsten contact formation in semiconductor devices.

BACKGROUND OF THE DISCLOSURE

In the case of ultra-scaled semiconductor devices, contact formation may entail selective deposition processes. Tungsten is frequently used to form contacts to semiconductor device elements in logic or memory devices. These semiconductor device elements may include transistors, resistors, capacitors, or other device elements.

In some examples, selective tungsten deposition may take place in vias that are formed to expose a device element of interest. According to some process schemes, selective tungsten deposition may be used to contact different types of semiconductor device structures within a common substrate. Vias for contacting these different semiconductor device structures may have different shapes or sizes. In addition, the chemical nature of the surfaces of the semiconductor device structures to be contacted may differ. Accordingly, robust processes are lacking for selective tungsten deposition to contact ultrascaled semiconductor devices.

With respect to these and other considerations, the present disclosure is provided.

SUMMARY OF THE DISCLOSURE

Disclosed are methods of selectively forming a contact structure in a semiconductor device. In one embodiment, a method may include providing a device structure in a substrate. The device structure may include a buried device contact, a first dielectric layer, disposed over the buried device contact; and a device element, where the device element includes a TiN layer. The method may include implanting an ion species into the TiN layer, wherein the ion species comprises a seed material for selective tungsten deposition.

In another embodiment, a method may include providing a device structure in a substrate, where the device structure includes a buried source/drain contact, a first dielectric layer, disposed over the buried source/drain contact, and a resistor stack. The resistor stack may include a TiN layer. The method may also include implanting an ion species into the TiN layer, wherein the ion species comprises Si, Al, or W.

In a further embodiment, a method may include providing a device structure in a substrate. The device structure may include a buried source/drain contact, a first dielectric layer, disposed over the buried source/drain contact, and a capacitor stack. The capacitor stack may include a lower SiN layer, disposed over the first dielectric layer, and a lower TiN layer, disposed over the lower SiN layer. The method may further include performing at a first instance a first ion implantation into the device structure, the first ion implantation comprising implanting an ion species into the lower TiN layer, wherein a lower seeded TiN layer is formed, for selective tungsten deposition.

BRIEF DESCRIPTION OF THE DRAWINGS

FIGS. 1A-1F depict side cross-sectional views of an approach for forming contacts in a semiconductor device in accordance with some embodiments of the present disclosure;

FIGS. 2A-2E depict side cross-sectional views of an approach for forming contacts in a semiconductor device in accordance with additional embodiments of the present disclosure;

FIG. 2F depicts a reference device structure;

FIG. 9 shows another exemplary process flow.

FIG. 10 illustrates a device structure according to embodiments of the disclosure.

Figure 1D:
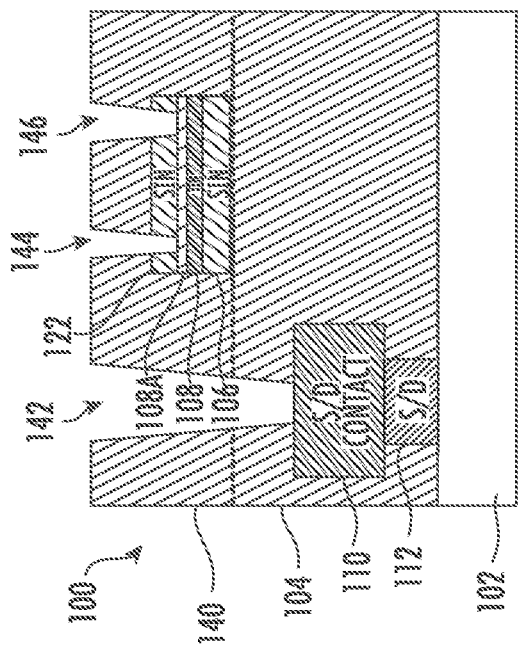

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function.

Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Turning now to FIG. 1A, there is shown a cross-sectional view of a device structure 100. The device structure 100 includes a substrate 102, and various other components, detailed below. The device structure 100 may represent a semiconductor device, such as a logic device, with various features not shown, or simplified for the purposes of illustration. The device structure 100 may include for example, transistor features, capacitors, resistors, and other components. The device structure 100 is shown at a stage of processing where certain transistor components have already been formed on the substrate 102. As shown in FIG. 1A, a source/drain region 112 has been formed as part of a transistor, with other portions of the transistor not shown. Additionally, a source/drain contact 110 has been formed on the source/drain region 112. The source/drain contact 110 may be cobalt, according to some non-limiting embodiments, or other suitable metal, like tungsten, Ruthenium, Titanium Nitride, etc, as known in the art.

FIG. 1A further illustrates that a first insulator layer, shown as a first dielectric layer 104 has been formed on the substrate 102, covering the source/drain contact 110 and source/drain region 112. The first dielectric layer 104 may be an interlevel dielectric material, for example, to serve as an insulator, within which layer metal contacts or metal wiring may be formed.

At the instance of FIG. 1A, a layer stack has been formed above the first dielectric layer 104, to serve as material for formation of a resistor, as discussed with respect to the figures to follow. The layer stack of such a resistor will include a resistor metal layer, as well as insulator layers, surrounding the resistor metal layer. In the embodiment of FIG. 1A, the layer stack at this instance includes a silicon nitride (SiN) layer 106 and a titanium nitride layer, TiN layer 108, disposed over the SiN layer 106. In various non-limiting embodiments, the thickness of the SiN layer 106 may range from 5 nm to 25 nm, while the thickness of the TiN layer 108 may range from 2 nm to 50 nm. Note that the TiN layer 108 will act as the active layer, meaning the metal layer, of a resistor to be formed. As an example, the thickness of the TiN layer 108 for a 7 nm technology node may be in the range of 5 nm, while the thickness of the silicon nitride layer is in the range of 11 nm.

Turning now to FIG. 1B, there is shown a subsequent instance where an ion implantation procedure is formed to implant a species that is shown as ions 120 into the TiN layer 108. Examples of suitable ions for implantation into the TiN layer 108 include silicon, aluminum, or tungsten. According to embodiments of the disclosure, the ion energy for ions 120 may be chosen to locate the majority of the ions 120 within the resistor metal layer, meaning within the TiN layer 108. The dose of ions 120 may likewise be chosen to generate a sufficient amount of seeds for subsequent processing. According to various non-limiting embodiments, the ion energy of ions 120 may range between 200 eV and 3 keV, with a higher energy more suitable for a greater thickness of the TiN layer 108. In various non-limiting embodiments the ion dose for ions 120 may range from $1E15/cm^2$ to $2E16/cm^2$.

Turning now to FIG. 1C, there is shown a subsequent instance to FIG. 1B, where a SiN layer 122 is formed over the implanted TiN layer, now shown as seeded TiN layer 108A. In the example shown, the seeded TiN layer 108A is shown as disposed over the original TiN layer, TiN layer 108, which layer is now reduced in thickness. As such, the SiN layer 106, seeded TiN layer 108A, TiN layer 108, and SiN layer 122 form the basic layer structure for a resistor to be formed. While the seeded TiN layer 108A includes implanted species derived from the ions 120, the underlying remaining TiN layer, that is, TiN layer 108, may also include some implanted species from the ions 120. Thus, the bilayer structure of seeded TiN layer 108A/TiN layer 108 is shown as two distinct layers for the purposes of clarity of illustration. Generally, the peak concentration of implanted species from ions 120 will be located in the seeded TiN layer 108A.

Turning now to FIG. 1D, there is shown a subsequent instance to FIG. 1C, where a patterning layer 124 has been deposited over the SiN layer 122, and patterned into a patterning feature 126 as shown. The patterning feature 126 has been used as a mask to etch the SiN layer 106, seeded TiN layer 108A, TiN layer 108, and SiN layer 122 to form the resistor 130. In the present embodiments, the patterning feature 126 may be formed of a mask material, including photoresist or other suitable mask material.

Figure 1E:
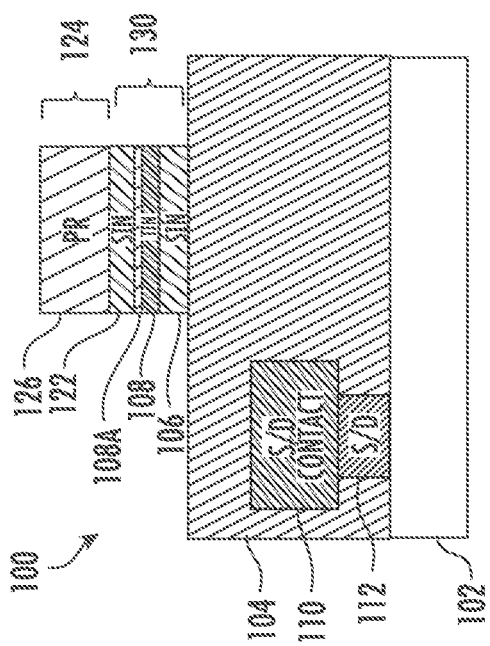

Turning now to FIG. 1E, there is shown a subsequent instance to FIG. 1D, where the patterning feature 126 has been removed, and a top insulator layer, shown as a second dielectric layer 140, has been deposited over the resistor 130. According to various embodiments, the second dielectric layer 140 may be formed of a similar material as first dielectric layer 104, such as an interlevel dielectric material. Regions of the second dielectric layer 140 and the first dielectric layer 104 have been subsequently patterned and etched to form a series of contact vias, shown as via 142, via 144, and via 146. As shown in FIG. 1E, theses vias are etched to the extent that the source/drain contact 110 is exposed, and the seeded TiN layer 108A is also exposed.

Figure 1F:
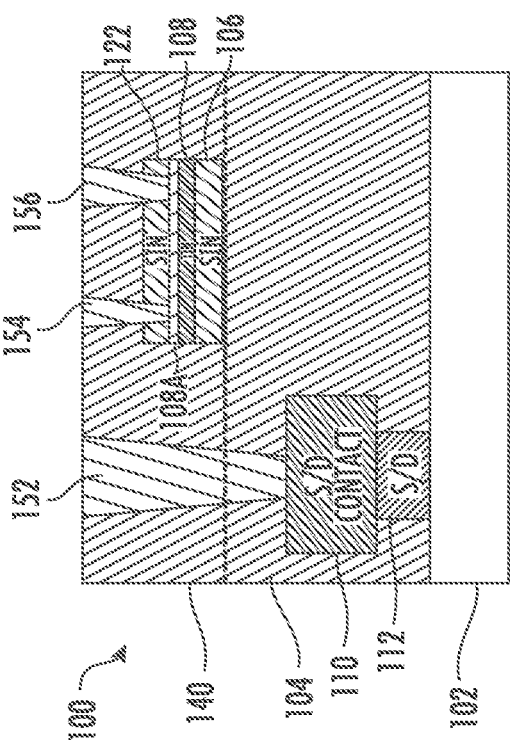

Turning to FIG. 1F, there is shown an instance subsequent to FIG. 1E, where the via 142, via 144, and via 146 have been filled with a conductive material, such as tungsten, thus forming conductive via 152, conductive via 154, and conductive via 156.

The process for forming the conductive vias may involve a selective deposition process, such as a selective CVD process. By way of background, according to known CVD W processing, selective CVD tungsten may be performed using a precursor chemical species such as $WF_6$. Accordingly, the process for forming the structure of FIG. 1F may employ similar chemistry, including precursors such as WF$_6$. As suggested by FIG. 1F, the selective growth of tungsten on the seeded TiN layer 108A is sufficient to completely fill the via 144 and via 146, as well as via 142.

By way of background, the present inventors have observed that selective tungsten growth on cobalt surfaces proceeds sufficiently well to form the conductive via 152 as shown. However, selective tungsten growth on TiN layers, such as at the bottom of a via, does not proceed sufficiently rapidly, resulting in underfilling of the via with conductive tungsten. The creation of the seeded TiN layer 108A addresses this issue by providing a different composition of the metallic layer at the bottom of via 144 and via 146. In particular, the seeded TiN layer 108A provides a silicon-rich surface in the case where ions 120 are silicon, or an aluminum-rich surface in the case where ions 120 are aluminum, or a tungsten-rich surface in the case where ions 120 are tungsten.

According to present understanding, and without limitation as to one particular theory, selective growth of tungsten may be based on the dissociation of adsorbed WF$_6$ where this dissociation is enhanced by electron donation from the substrate. Thus, surfaces having lower electronegativity may enhance selective tungsten deposition. Examples of materials of lower electronegativity with respect to TiN include aluminum and silicon. Accordingly, the formation of the conductive via 154 and conductive via 156 by selective CVD of tungsten on a seeded TiN surface proceeds more readily than selective CVD of tungsten on an unseeded TiN surface. This approach also has the advantage that deposition of an additional seed layer, such as a W layer on the TiN layer 108 is not needed, avoiding problems resulting from the deposition of an extra layer within a via.

According to further embodiments of the disclosure, the operations shown in FIGS. 1A-1F may be modified to seed a TiN layer after formation of a complete resistor layer stack Turning now to FIG. 2A, there is shown a cross-sectional view of a device structure 200. The device structure 200 may have a similar structure as the device structure 100, at the stage of fabrication shown in FIG. 1C, discussed above. A difference is that the TiN layer 108 has not been implanted, while the SiN layer 122 has already been deposited upon the TiN layer 108. Thus, at this stage of operation, the structure of the resistor stack 210 from which stack a resistor is to be constructed includes the SiN layer 106, unimplanted TiN layer, that is, TiN layer 108, and SiN layer 122.

Turning now to FIG. 2B, there is shown a subsequent instance where an ion implantation procedure is formed to implant a species that is shown as ions 220 into the TiN layer 108. In this instance, the ions 220 are implanted into the resistor stack 210, including the SiN layer 122. Examples of suitable ions for implantation into the TiN layer 108 with the SiN layer 122 in place include silicon ions. According to embodiments of the disclosure, the ion energy for ions 220 may be chosen to locate the a large fraction of the ions 220 within the resistor metal layer, meaning within the TiN layer 108. For example, the ion energy may be chosen so the peak concentration of ions 220 lies within the TiN layer 108. The dose of ions 120 may likewise be chosen to generate a sufficient amount of seeding material within the TiN layer 108 to enhance subsequent selective CVD growth. According to various non-limiting embodiments, the ion energy of ions 120 may range between 20 keV and 120 keV, with a higher energy more suitable for a greater thickness of the SiN layer 122 and/or greater thickness of the TiN layer 108. In various non-limiting embodiments the ion dose for ions 120 may range from 1E16/cm$^2$ to 5E16/cm$^2$.

Turning now to FIG. 2C, there is shown a subsequent instance to FIG. 2B, where a patterning layer 124 has been deposited over the SiN layer 122, and patterned into a patterning feature 126 as shown. The patterning feature 126 has been used as a mask to etch the SiN layer 106, and the now implanted TiN layer, shown as seeded TiN layer 108B, the underlying TiN layer, shown as TiN layer 108, and SiN layer 122. As such, the patterning has formed the resistor 230. As with the embodiment of FIG. 1C, the seeded TiN layer 108B is shown as disposed over the original TiN layer, TiN layer 108, which layer is now reduced in thickness. Generally, the peak concentration of implanted species from ions 220 will be located in the seeded TiN layer 108B.

Turning now to FIG. 2D, there is shown a subsequent instance to FIG. 2C, where the patterning feature 126 has been removed, and a second dielectric layer 140 has been deposited over the resistor 130, as described above with respect to FIG. 1E. Regions of the second dielectric layer 140 and the first dielectric layer 104 have been subsequently patterned and etched to form a series of contact vias, shown as via 142, via 144, and via 146, as also described above with respect to FIG. 1E.

Turning to FIG. 2E, there is shown an instance subsequent to FIG. 2D, where the via 142, via 144, and via 146 have been filled with a conductive material, such as tungsten, thus forming conductive via 152, conductive via 154, and conductive via 156. The filling of these vias may take place via a selective tungsten CVD process, described above. As suggested by FIG. 2E, the selective growth of tungsten on the seeded TiN layer 108B is sufficient to completely fill the via 144 and via 146, as well as via 142.

By way of explanation, FIG. 2F depicts a reference device structure 250. In this example, all the components of the reference device structure 250 may be similar to or the same as corresponding components of device structure 200. A difference between reference device structure 250 and device structure 200 is that the TiN layer 108 in reference device structure 250 remains unseeded, that is, ion implantation has not be performed to introduce a seeding material into the TiN layer 108, to form an overlayer of seeded TiN. As such, the conductive via 152 may be filled during a selective tungsten deposition process, since tungsten may readily nucleate and grow on the source/drain contact 110. In contrast, tungsten may nucleate and grow less readily on the unimplanted TiN layer, that is, TiN layer 108, leading to the underfilled structure of conductive via 154A and conductive via 156A.

Examples

Figure 3:
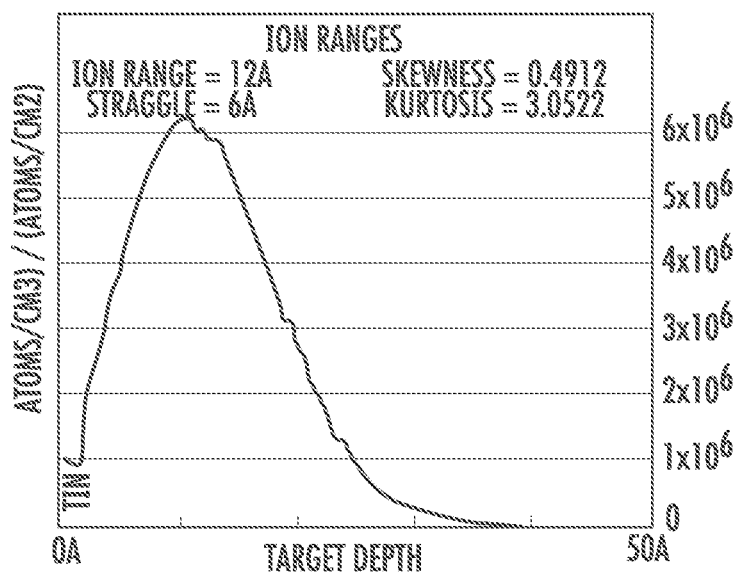
FIG. 3 depicts an exemplary implantation profile in accordance with embodiments of the disclosure.

FIGS. 3-6 depict the results of simulation of exemplary ion implantation profiles suitable for seeding a TiN layer for selective CVD, in accordance with embodiments of the disclosure. FIG. 3 depicts an exemplary implantation profile in accordance with embodiments of the disclosure. In particular, FIG. 3 depicts a graph representing a TRIM simulation of silicon ion implantation into a layer of TiN. The silicon ion energy is set to 500 eV, with an ion angle at 15 degrees with respect to normal to the substrate surface. In this example, the ion dose is 1.6 E13 atom/cm$^2$. The x-axis extends from the surface of the TiN layer (at 0 Å) to a depth of 50 Å below the surface. The ion range places the peak concentration of Si atoms at 12 Å below the surface, with a straggle of 6 Å, placing the large majority of ions within 20 Å of the surface. The tilting of the ion trajectories to be non-normal to the surface will place the ion range closer to the surface.

Figure 4:
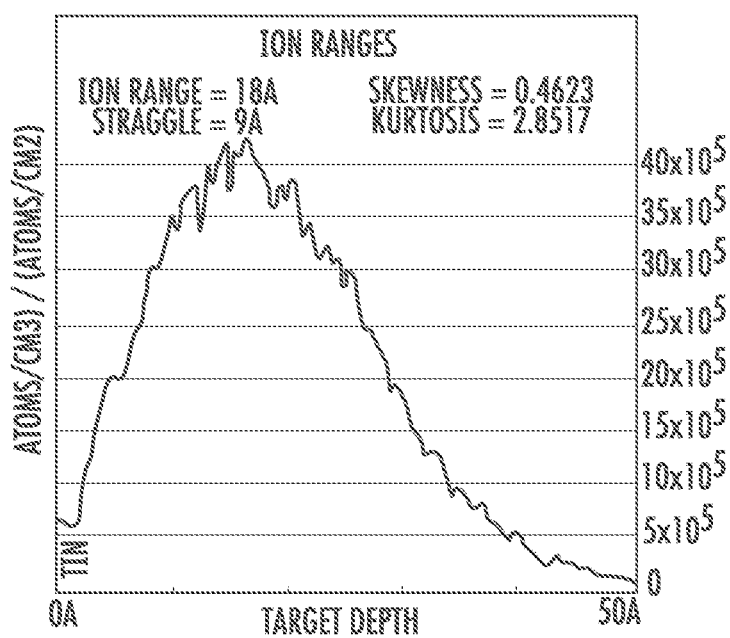
FIG. 4 depicts another exemplary implantation profile in accordance with embodiments of the disclosure.

FIG. 4 depicts another exemplary implantation profile in accordance with embodiments of the disclosure. FIG. 4 also depicts a graph representing a TRIM simulation of silicon ion implantation into a layer of TiN. The silicon ion energy is set to 1 keV, with an ion angle at 15 degrees with respect to normal to the substrate surface. In this example, the ion dose is 2.5 E13 atom/cm$^2$. As shown, the ion range places the peak concentration of Si atoms at 18 Å below the surface, with a straggle of 9 Å, placing the large majority of ions within 30 Å of the surface. The tilting of the ion trajectories to be non-normal to the surface will place the ion range closer to the surface.

Figure 5A:
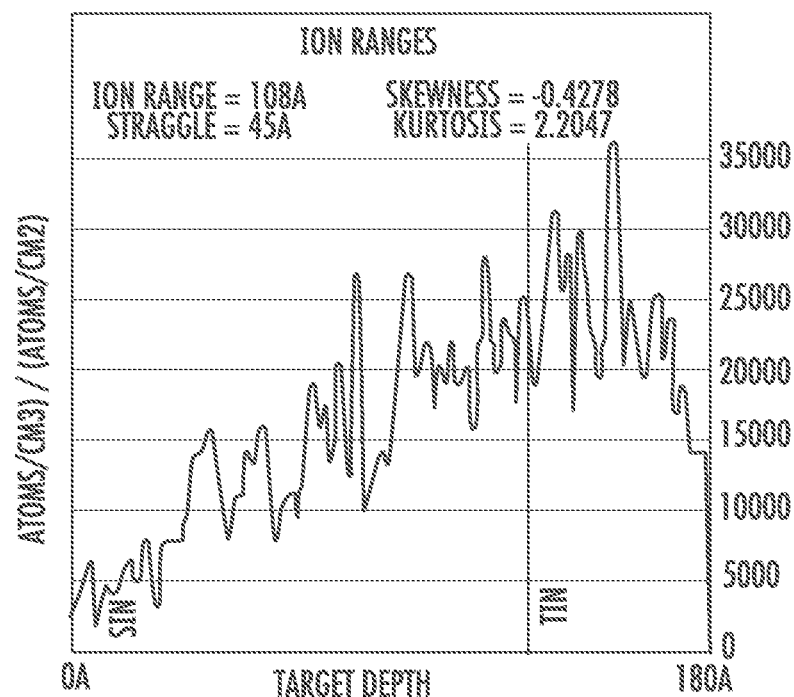
FIG. 5A depicts a further exemplary implantation profile in accordance with embodiments of the disclosure.
Figure 5B:
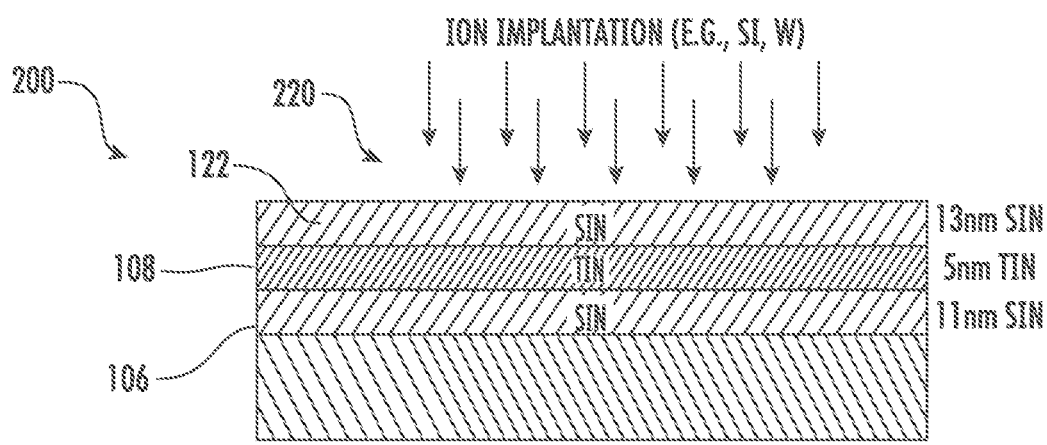
FIG. 5B depicts a portion of a device structure corresponding to the implantation profile of FIG. 5A.

FIG. 5A depicts another exemplary implantation profile in accordance with embodiments of the disclosure. FIG. 5A also depicts a graph representing a TRIM simulation of silicon ion implantation into a layer of TiN. The silicon ion energy is set to 30 keV, with an ion angle at 0 degrees with respect to normal to the substrate surface. In this example, the ion dose is 2.5 E16 atom/cm$^2$. The target in this model is a trilayer structure as depicted in FIG. 5B, as generally described above with respect to the resistor structure of FIG. 2B. In particular, the top layer is 13 nm-thick SiN, followed by a middle layer of 5 nm-thick TiN, and an underlayer of 11 nm-thick TiN. The x-axis extends to a depth 180 Å below the surface of the upper SiN layer, equivalent to the lower surface of the TiN layer. As shown, the ion range places the peak concentration of Si atoms at 20 Å below the upper surface of the TiN layer. In view of the above results, the ion energy selected for the embodiment of FIGS. 2A-2F, where implantation takes place through an upper SiN layer, will generally be on the order of 20 keV or more, in order to efficiently seed Si species into the TiN layer to serve as the resistor metal. The ion energy selected for the embodiment of FIGS. 1A-1F may be much lower, such as between two hundred eV and 3 keV, since this energy range will locate most of the ions within a TiN layer of 5 nm thickness, and in particular, will locate a high concentration of Si species within the first few nanometers of the upper surface for example.

Figure 6:
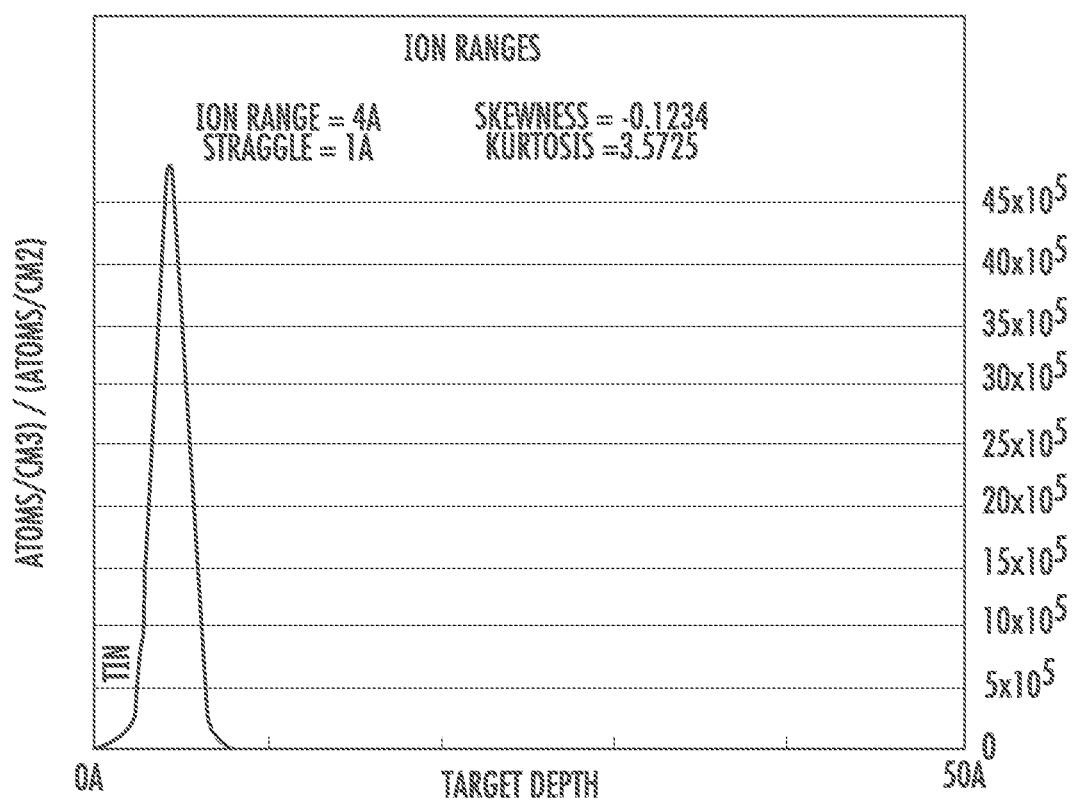
FIG. 6 depicts an additional exemplary implantation profile in accordance with embodiments of the disclosure.

FIG. 6 depicts an exemplary implantation profile in accordance with further embodiments of the disclosure. In particular, FIG. 6 depicts a graph representing a TRIM simulation of tungsten (W) ion implantation into a layer of TiN. The tungsten ion energy is set to 1 keV, with an ion angle at 45 degrees with respect to normal to the substrate surface. In this example, the ion dose is 2.5 E12 atom/cm$^2$. The x-axis extends from the surface of the TiN layer (at 0 Å) to a depth of 50 Å below the surface. The ion range places the peak concentration of W atoms at 4 Å below the surface, with a straggle of 1 Å, placing the entirety of W ions within 8 Å of the surface. The tilting of the ion trajectories to be non-normal to the surface will place the ion range closer to the surface.

Note that the above results of FIG. 6 suggest that lower tilt angles will also place the W ions sufficiently close to the upper surface of the TiN layer for the purposes of providing a high surface concentration for seeding selective CVD growth. Note also that the implantation of W ions to place seeding material near the surface of a TiN layer avoids the need to deposit a separate seeding layer within a via for example, where the via aspect ratio may be too high to facilitate such a layer growth.

Figure 7:
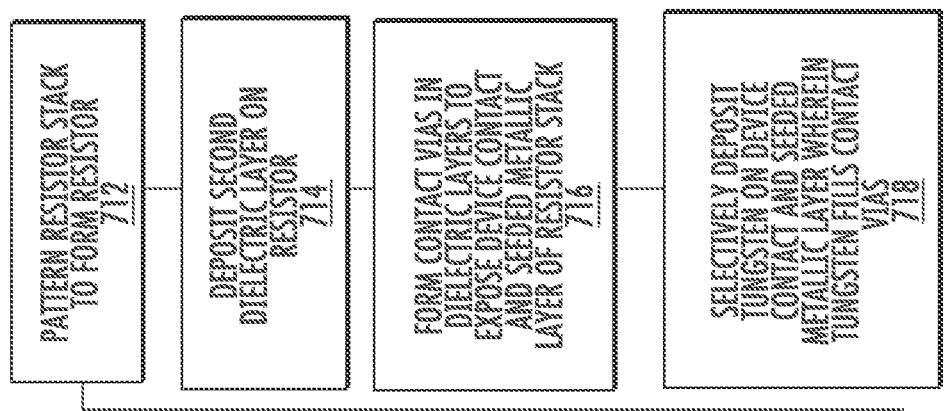
FIG. 7 shows an exemplary process flow.
Figure 7:
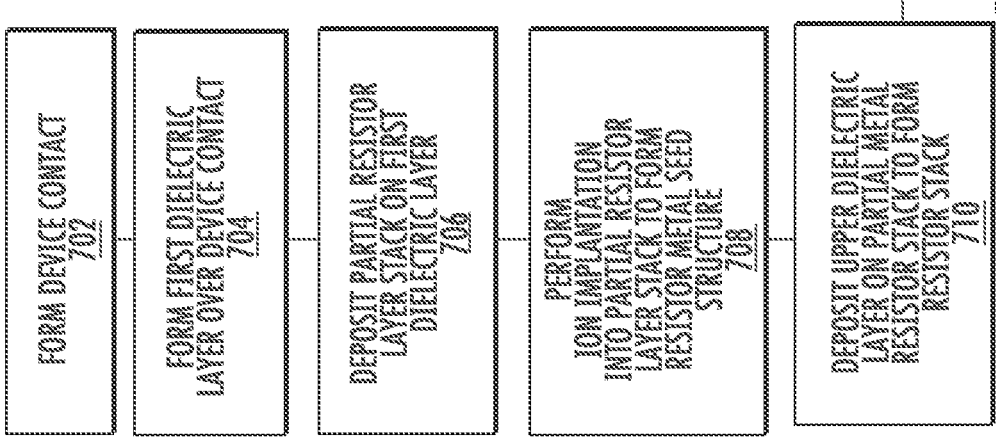

FIG. 7 shows an exemplary process flow 700, in accordance with embodiments of the disclosure. At block 702 a device contact is formed within a substrate. In some examples, the device contact may be a source/drain contact for a transistor, such as a logic circuit transistor or a memory transistor that is formed as part of integrated circuitry built on the substrate. In some examples the device contact may be a metal suitable for acting as a template or surface for selective deposition of a contacting metal. For example, the device contact may be cobalt of other metal that serves as a template for selective growth of a tungsten contacting metal layer.

At block 704, a first dielectric layer is formed over the device contact. The first dielectric layer may be an interlevel dielectric material to serve as isolation between metal vias and metal wiring of the integrated circuitry.

At block 706, a partial resistor layer stack is deposited on the first dielectric layer. The partial metal resistor stack may include a lower insulator layer, such as a SiN layer, and an upper metallic layer, such as a TiN layer.

At block 708, an ion implantation operation is performed into the partial metal resistor stack to form an resistor metal seed structure. The resistor metal seed structure may be formed within the upper metallic layer of the partial resistor layer stack. For example, a suitable ion species such as silicon, aluminum, or tungsten may be implanted at a suitable ion energy into the upper metallic layer, such as TiN, in order to locate a peak concentration of the ion species near the surface of the upper metallic layer, such as within 1 nm, within 2 nm, or within 3 nm of the upper surface. The ion dose may be. As such, the implanted ion species may serve as a template for later growth of a CVD metal layer.

At block 710, an upper dielectric (insulator) layer is deposited on the partial resistor layer stack, to form a resistor stack. The upper insulator layer may be the same as the lower insulator layer in some examples, such as SiN. As such, the resistor stack may include a lower insulator layer, a seeded metallic layer, having the resistor metal seed structure, as described above, and an upper insulator layer.

At block 712, the resistor stack is patterned to form a resistor. The patterning may take place according to know lithographic and etching operations that are suitable for etching the layers of the resistor stack. As such, a resistor having the targeted shape and size is formed, with the resistor stack.

At block 714, a second dielectric layer is deposited over the resistor stack. In some embodiments, the second dielectric layer may be formed of the same material as the first dielectric layer.

At block 716, contact vias are formed in the first and second dielectric layers to expose the device contact and the seeded metallic layer of the resistor stack. The contact vias may be formed using known lithographic and etching operations that are suitable for etching dielectric layers, such as interlevel dielectric, including $SiO_2$. In one example, two contact vias may be formed to contact the seeded metallic layer towards opposite ends of the resistor, in order to form external electrical connection to the seeded metallic layer.

At block 718, tungsten is selectively deposited on the device contact and the seeded metallic layer of the resistor stack. The selective deposition may be performed using known selective CVD processes for depositing tungsten, such as CVD processes that employ $WF_6$ as a precursor. Because the seeded metallic layer of the resistor stack includes implanted species near the upper surface of the seeded metallic layer, such as silicon, tungsten, or aluminum, the selective W growth may occur more readily than in the case where the metallic layer is unseeded, such as a TiN layer without implanted Si.

Figure 8:
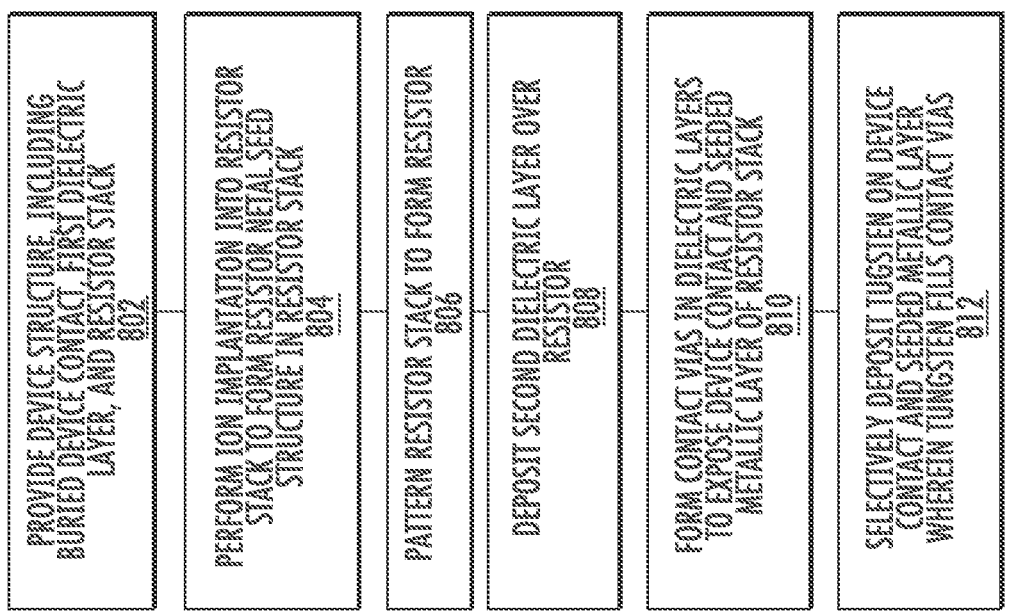
FIG. 8 shows an additional exemplary process flow.

FIG. 8 shows another exemplary process flow 800, in accordance with embodiments of the disclosure. At block

802, a device structure is provided. The device structure may include a buried device contact. The buried device contact may be a source/drain contact for a transistor, such as a logic circuit transistor or a memory transistor that is formed as part of integrated circuitry built on the substrate. In some examples the device contact may be a metal suitable for acting as a template or surface for selective deposition of a contacting metal. For example, the device contact may be cobalt of other metal that serves as a template for selective growth of a tungsten contacting metal layer. The device structure may further include a first dielectric layer, disposed over the buried device contact, and a resistor stack disposed over the first dielectric layer. The first dielectric layer may be an interlevel dielectric material to serve as isolation between metal vias and metal wiring of the integrated circuitry. The resistor stack may include a lower insulator layer, such as SiN, a metal resistor layer, such as TiN, and an upper insulator layer, such as SiN.

At block 804, ion implantation procedure is performed into the resistor stack to form a resistor metal seed structure in the resistor stack. In particular, the resistor metal seed structure may be formed within the metal resistor layer of the resistor stack. As such, the ion energy and ion dose may be chosen to place a peak concentration of ions within the metal resistor layer. For example, a suitable ion species such as silicon, may be implanted at a suitable ion energy through the upper insulator layer and into the metallic resistor layer, such as TiN, in order to locate a peak concentration of the ion species near the surface of the metallic resistor layer, such as within 1 nm, within 2 nm, or within 3 nm of the upper surface. The ion dose may be.

At block 806, the resistor stack is patterned. The patterning may take place according to know lithographic and etching operations that are suitable for etching the layers of the resistor stack. As such, a resistor having the targeted shape and size is formed, with the resistor stack.

At block 808, a second dielectric layer is deposited over the resistor. In some embodiments, the second dielectric layer may be formed of the same material as the first dielectric layer.

At block 810 contact vias are formed in the first and second dielectric layers to expose the device contact and the seeded metallic layer of the resistor stack. The contact vias may be formed using known lithographic and etching operations that are suitable for etching dielectric layers, such as interlevel dielectric, including $SiO_2$. In one example, two contact vias may be formed to contact the seeded metallic layer towards opposite ends of the resistor, in order to form external electrical connection to the seeded metallic layer.

At block 812 tungsten is selectively deposited on the device contact and the seeded metallic layer of the resistor, wherein the tungsten fills the contact vias. The selective deposition may be performed using known selective CVD processes for depositing tungsten, such as CVD processes that employ $WF_6$ as a precursor. Because the seeded metallic layer of the resistor stack includes implanted species near the upper surface of the seeded metallic layer, such as silicon, tungsten, or aluminum, the selective W growth may occur more readily than in the case where the metallic layer is unseeded, such as a TiN layer without implanted Si.

While the aforementioned embodiments are centered upon enhancing selective tungsten growth to form contacts to TiN layers within resistors, in other embodiments, ion implantation may be performed into TiN layers used as capacitor metal layers, in order to enhance selective tungsten growth for contacting the TiN layer in a capacitor. For such capacitor formation, two separate TiN layers may be provided as capacitor electrodes, where the two separate TiN layers are implanted separately to form seeded TiN layers for formation of subsequently deposited selective tungsten contacts.

To illustrate this structure, FIG. 9 presents another exemplary process flow 900. At block 902, a device structure is provided, including a buried device contact, first dielectric layer, disposed over the buried device contact, a lower SiN layer, disposed over the dielectric layer, and a lower TiN layer, disposed over the lower SiN layer. The lower TiN layer may form the basis of a lower capacitor electrode in a capacitor to be formed.

At block 904, a first ion implantation procedure is performed into the lower TiN layer to form a lower seeded TiN layer. The ion implantation may be performed generally according to the aforementioned embodiments.

At block 906, an intermediate SiN layer is deposited over the lower seeded TiN layer.

At block 908, an upper TiN layer is deposited over the intermediate SiN layer. The upper TiN layer may serve as the basis for an upper electrode of the capacitor to be formed.

At block 910, a second ion implantation procedure is performed into the upper TiN layer to form an upper seeded TiN layer. The ion implantation may be performed generally according to the aforementioned embodiments.

At block 912 an upper SiN layer may be deposited upon the upper seeded TiN layer, to form a capacitor structure.

At block 914, a first capacitor via is formed to expose the lower seeded TiN layer. The first capacitor via may be formed after an upper dielectric layer is deposited over the structure formed after block 912, as generally described with respect to block 710 or block 808. As such, the first capacitor via may extend through the upper dielectric layer, and through one or more layers of the capacitor structure to contact the lower seeded TiN layer.

At block 916, a second capacitor via is formed to expose the upper seeded TiN layer. According to various embodiments, the first capacitor via and the second capacitor via may be formed in separate lithography and etching operations, since the first capacitor via will extend through more layers than the second capacitor via. In some embodiments, the operation of block 916 may be performed before or after the operation of the block 914.

At block 918, a buried device via is formed to expose the buried device contact.

At block 920 tungsten is selectively deposited within the on the device contact, the lower seeded TiN layer, and the upper seeded TiN layer, in the exposed regions of the vias formed in the operation of blocks 914-918. As such, the tungsten may be deposited in one selective deposition operation in a manner that fills the first capacitor via, second capacitor via, and buried device via.

In some embodiments, the capacitor as formed in the operation of FIG. 9 may be used as a metal resistor, capacitor or both based on the location/layers the device is in contact with. FIG. 10 depicts an embodiment of a device structure, illustrating a capacitor structure 270, consistent with the process flow of FIG. 9. The capacitor structure 270 is disposed on the first dielectric layer 104. As with other embodiments, in this embodiment, a buried device contact (not shown) may be disposed under the first dielectric layer 104. The capacitor structure 270 includes a lower SiN layer 272, disposed over the dielectric layer, and lower TiN layer 274, disposed over the lower SiN layer 272, as well as lower seeded TiN layer 276, disposed on the lower TiN layer 274. The capacitor structure 270 also includes an intermediate SiN layer 278, disposed over the lower seeded TiN layer 276, an upper TiN layer 280, disposed over the intermediate SiN layer 278, an upper seeded TiN layer 282, disposed over the upper TiN layer 280, an upper SiN layer 284, disposed over the upper seeded TiN layer 282. In the example of FIG. 10, the capacitor structure is completed by formation of a first conductive via 286, to contact the upper seeded TiN layer 282, as well as a second conductive via 288, to contact the lower seeded TiN layer 276.

According to further embodiments, the general layer structure of FIG. 10 may serve as a template to form different combination of devices, by appropriate selection of conductive vias. In addition to the capacitor structure shown, a first resistor structure may be formed by forming an upper resistor contact via that is filled with a metal to form a conductive via 290, in conjunction with the first conductive via 286, to form an upper resistor, using the upper seeded TiN layer 282 and the upper TiN layer 280 (optionally without the second conductive via 288). Alternatively, a second resistor structure may be formed by forming a lower resistor contact via that is filled with a metal to form conductive via 292, in conjunction with the second conductive via 288, to form a lower resistor, using the lower seeded TiN layer 276 and the lower TiN layer 274 (optionally without the first conductive via 286). In addition, an upper combination-resistor-and-capacitor may be formed using the first conductive via 286, second conductive via 288, and conductive via 290, or a lower combination-resistor-and-capacitor may be formed using the first conductive via 286, second conductive via 288, and conductive via 292.

In view of the foregoing, at least the following advantages are achieved by the embodiments disclosed herein. A first advantage is that the formation of a seeded resistor metal layer is compatible with present day process flows for synthesizing transistor and resistor devices in integrated circuits. Another advantage is that the approach of the present embodiments improves selective CVD tungsten growth while not entailing any change in physical thickness of the resistor metal layer, such as the result when depositing an extra seed layer to promote selective CVD growth.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of selectively forming a contact structure in a semiconductor device, comprising:
providing device structure in a substrate, the device structure comprising:
a buried device contact;
a first dielectric layer, disposed over the buried device contact; and
a device element, the device element comprising a TiN layer; and
implanting an ion species into the TiN layer, wherein the ion species comprises a seed material for selective tungsten deposition.

2. The method of claim 1, further comprising:
forming a set of contact vias over the TiN layer after the implanting; and
performing a selective tungsten deposition process to deposit a tungsten contact on the TiN layer, within the set of contact vias.

3. The method of claim 1, the ion species comprising Si, Al, or W.

4. The method of claim 1, wherein, during the implanting, the TiN layer is exposed on an outer surface to the ion species, wherein the ion species is implanted at an ion energy of 200 eV to 3 keV.

5. The method of claim 4, wherein the TiN layer comprising a thickness of 3 nm to 10 nm.

6. The method of claim 1, wherein during the implanting, the TiN layer is disposed subjacent to an upper insulator layer having a thickness in a range of 8 nm to 20 nm, and wherein the ion species is implanted at an ion energy of 15 keV to 40 keV.

7. The method of claim 2, wherein the selective tungsten deposition process comprises a selective W CVD process using $WF_6$ as a precursor.

8. The method of claim 2, wherein the set of contact vias comprises a first contact via and a second contact via.

9. The method of claim 2, further comprising:
before the performing the selective tungsten deposition process, forming a source/drain contact via over the buried device contact, concurrently with the forming the set of contact vias over the TiN layer.

10. The method of claim 9, the buried device contact comprising cobalt.

11. The method of claim 9, wherein the selective tungsten deposition process forms an additional tungsten contact on the buried device contact, within the source/drain contact via.

12. A method of selectively forming a contact structure in a semiconductor device, comprising:
providing a device structure in a substrate, the device structure comprising:
a buried source/drain contact;
a first dielectric layer, disposed over the buried source/drain contact; and
a resistor stack, the resistor stack comprising a TiN layer; and
implanting an ion species into the TiN layer, wherein the ion species comprises Si, Al, or W.

13. The method of claim 12, further comprising:
forming a set of contact vias over the TiN layer after the implanting; and
performing a selective tungsten deposition process to deposit a tungsten contact on the TiN layer, within the set of contact vias.

14. The method of claim 12, wherein, during the implanting, the TiN layer is exposed on an outer surface to the ion species, wherein the ion species is implanted at an ion energy of 200 eV to 3 keV, wherein the TiN layer comprising a thickness of 3 nm to 10 nm.

15. The method of claim 12, wherein during the implanting, the TiN layer is disposed subjacent to an upper insulator layer having a thickness in a range of 8 nm to 20 nm, and wherein the ion species is implanted at an ion energy of 15 keV to 40 keV.

16. A method of selectively forming a contact structure in a semiconductor device, comprising:
providing a device structure in a substrate, the device structure comprising:
a buried source/drain contact;
a first dielectric layer, disposed over the buried source/drain contact;

a capacitor stack, the capacitor stack comprising:
   a lower SiN layer, disposed over the first dielectric layer; and
   a lower TiN layer, disposed over the lower SiN layer; and performing at a first instance a first ion implantation into the device structure, the first ion implantation comprising implanting an ion species into the lower TiN layer, wherein a lower seeded TiN layer is formed, for selective tungsten deposition.

17. The method of claim 16, further comprising:

performing during a second instance, after the first instance, a second ion implantation into the device structure, wherein at the second instance the device structure further comprises an intermediate SiN layer, disposed on the lower seeded TiN layer, and an upper TiN layer, disposed on the intermediate SiN layer, wherein the second ion implantation comprises:

implanting an ion species into the upper TiN layer, wherein an upper seeded TiN layer is formed, for selective tungsten deposition.

18. The method of claim 17, further comprising:

forming a plurality of contact vias to expose the buried source/drain contact, the lower seeded TiN layer in a first location, and the upper seeded TiN layer in a second location; and performing a selective tungsten deposition process to deposit a tungsten contact on the buried source/drain contact, the lower seeded TiN layer, and the upper seeded TiN layer within the plurality of contact vias.

19. The method of claim 18, further comprising:

forming an upper resistor contact via to expose the upper seeded TiN layer in a third location, wherein the selective tungsten deposition process further deposits a tungsten contact on the upper seeded TiN layer within the upper resistor contact via.

20. The method of claim 18, further comprising:

forming a lower resistor contact via to expose the lower seeded TiN layer in a fourth location, wherein the selective tungsten deposition process further deposits a tungsten contact on the lower seeded TiN layer within the lower resistor contact via.

\* \* \* \* \*